United States Patent
Perez et al.

(10) Patent No.: US 11,515,781 B2
(45) Date of Patent: Nov. 29, 2022

(54) INVERTER WITH A CURRENT SOURCE PROVIDED WITH A PROTECTION CIRCUIT

(71) Applicant: Commissariat à l'Énergie Atomique et aux Énergies Alternatives, Paris (FR)

(72) Inventors: Gaëtan Perez, Grenoble (FR); Anthony Bier, Grenoble (FR); Stéphane Catellani, Grenoble (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 0 days.

(21) Appl. No.: 17/025,839

(22) Filed: Sep. 18, 2020

(65) Prior Publication Data

US 2021/0091663 A1    Mar. 25, 2021

(30) Foreign Application Priority Data

Sep. 24, 2019 (FR) ...................................... 1910530

(51) Int. Cl.
  *H02M 1/32*  (2007.01)
  *H02M 7/537*  (2006.01)
  *H03K 19/20*  (2006.01)

(52) U.S. Cl.
  CPC ............. *H02M 1/32* (2013.01); *H02M 7/537* (2013.01); *H03K 19/20* (2013.01)

(58) Field of Classification Search
  CPC .......... H02M 1/32; H02M 1/325; H02M 1/08; H02M 7/537; H02M 7/5387; H03K 19/20
  See application file for complete search history.

(56) References Cited

U.S. PATENT DOCUMENTS

| | | | | |
|---|---|---|---|---|
| 2012/0075753 A1* | 3/2012 | Watanabe | ............. | B60L 15/007 361/18 |
| 2014/0168840 A1* | 6/2014 | Hafner | .................... | H03K 17/78 361/86 |
| 2014/0218833 A1* | 8/2014 | Wu | ..................... | H03K 17/0828 361/93.1 |
| 2015/0263514 A1* | 9/2015 | Koishi | .................... | H02M 1/08 361/93.7 |

FOREIGN PATENT DOCUMENTS

| | | |
|---|---|---|
| JP | S61-244276 A | 10/1986 |
| JP | S62-160079 A | 7/1987 |

OTHER PUBLICATIONS

Preliminary Search Report for French Application No. 1910530, dated May 19, 2020.

* cited by examiner

*Primary Examiner* — Kyle J Moody
*Assistant Examiner* — Jye-June Lee
(74) *Attorney, Agent, or Firm* — Wolf, Greenfield & Sacks, P.C.

(57) ABSTRACT

A current source inverter, including: a first switching cell including at least first and second power switches coupling a same first input node of the inverter respectively to first and second output nodes of the inverter; and a circuit of protection against a placing in open circuit of an input current source of the inverter.

11 Claims, 2 Drawing Sheets

INVERTER WITH A CURRENT SOURCE PROVIDED WITH A PROTECTION CIRCUIT

Cross-Reference to Related Application

This application claims the priority benefit of French patent application number FR 1910530, filed on Sep. 24, 2019. The contents of which is incorporated herein by reference in its entirety.

TECHNICAL BACKGROUND

The present disclosure generally concerns the field of electronic circuits. It more particularly concerns the field of inverters comprising a current source and particularly aims at a current source inverter protection circuit.

PRIOR ART

An inverter is an electronic circuit enabling to generate AC power supply voltages and currents from a DC power source.

The inverters most often used in the industry are called voltage source inverters, or voltage input inverters, that is, they comprise a capacitor connected in parallel with the DC power source at the inverter input.

Current source inverters, also called CSI, or current input inverters, comprising an inductance series-connected with the DC power source at input of the inverter, have also been provided.

It would be desirable to at least partly improve certain aspects of known current source inverters.

SUMMARY

For this purpose, an embodiment provides a current source inverter, comprising:
- a first switching cell comprising at least first and second power switches coupling a same first input node of the inverter respectively to first and second output nodes of the inverter; and
- a circuit of protection against a placing in open circuit of an input current source of the inverter, comprising, for each power switch of the first switching cell:
- a protection switch coupling a node for supplying a set point signal for controlling the power switch to a control node of the power switch;
- a circuit for detecting the off or on state of the power switch; and
- a circuit for controlling the protection switch receiving, for each of the other power switch(es) of the first switching cell, an output signal of the detection circuit of the other power switch.

According to an embodiment, for each power switch of the switching cell, the control circuit of the switch for protecting the power switch is configured to control the protection switch to the on state when at least one of the other power switch(es) of the first switching cell is in the on state, and to control the protection switch to the off state when no other power switch of the first switching cell is in the on state.

According to an embodiment, the first switching cell further comprises a third power switch coupling the first input node of the inverter to a third output node of the inverter.

According to an embodiment, the inverter further comprises a second switching cell comprising at least first and second power switches respectively coupling the first and second output nodes of the inverter to a same input node of the inverter, and the protection circuit comprises, for each power switch of the second switching cell:
- a protection switch coupling a node for supplying a control signal of the power switch to a control node of the power switch;
- a circuit for detecting the off or on state of the power switch; and
- a circuit for controlling the protection switch receiving, for each of the other power switch(es) of the second switching cell, an output signal of the detection circuit of the other power switch.

According to an embodiment, for each power switch of the second switching cell, the control circuit of the switch for protecting the power switch is configured to control the protection switch to the on state when at least one of the other power switch(es) of the second switching cell is in the on state, and to control the protection switch to the off state when no other power switch of the second switching cell is in the on state.

According to an embodiment, the second switching cell further comprises a third power switch coupling a third output node of the inverter to the second input node of the inverter.

According to an embodiment, the inverter further comprises a circuit for detecting the presence of an input current in the inverter, each control circuit receiving an output signal of the circuit for detecting the presence of an input current and being configured to control the protection switch with which it is associated to the off state only when an input current is detected in the inverter.

According to an embodiment, the protection circuit further comprises, for each power switch, a resistor having a first end connected to a conduction node of the protection switch opposite to the node for supplying the set point signal for controlling the power switch, and a second end connected to a node of application of a control voltage in the on state of the power switch.

According to an embodiment, the inverter further comprises, for each power switch, a driver circuit of close control circuit having an input node connected to the conduction node of the protection switch opposite to the node for supplying the set point signal for controlling the power switch, and an output node connected to the power switch control node.

According to an embodiment, the inverter further comprises a control circuit or remote control circuit common to all the power switches and supplying the set point signals for controlling the different power switches.

According to an embodiment, for each power switch, the circuit for detecting the off or on state of the power switch comprises a circuit of differential measurement of a voltage between the control node of the power switch and a conduction node of the power switch.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DESCRIPTION OF THE EMBODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the control circuits of the power switches of the described image sensors are not detailed, the forming of such control circuits being within the abilities of those skilled in the art based on the functional indications of the present description.

Unless specified otherwise, when reference is made to two elements connected together, this signifies a direct connection without any intermediate elements other than conductors, and when reference is made to two elements coupled together, this signifies that these two elements can be connected or they can be coupled via one or more other elements.

Unless specified otherwise, the expressions "around", "approximately", "substantially" and "in the order of" signify within 10%, and preferably within 5%.

Figure 1:
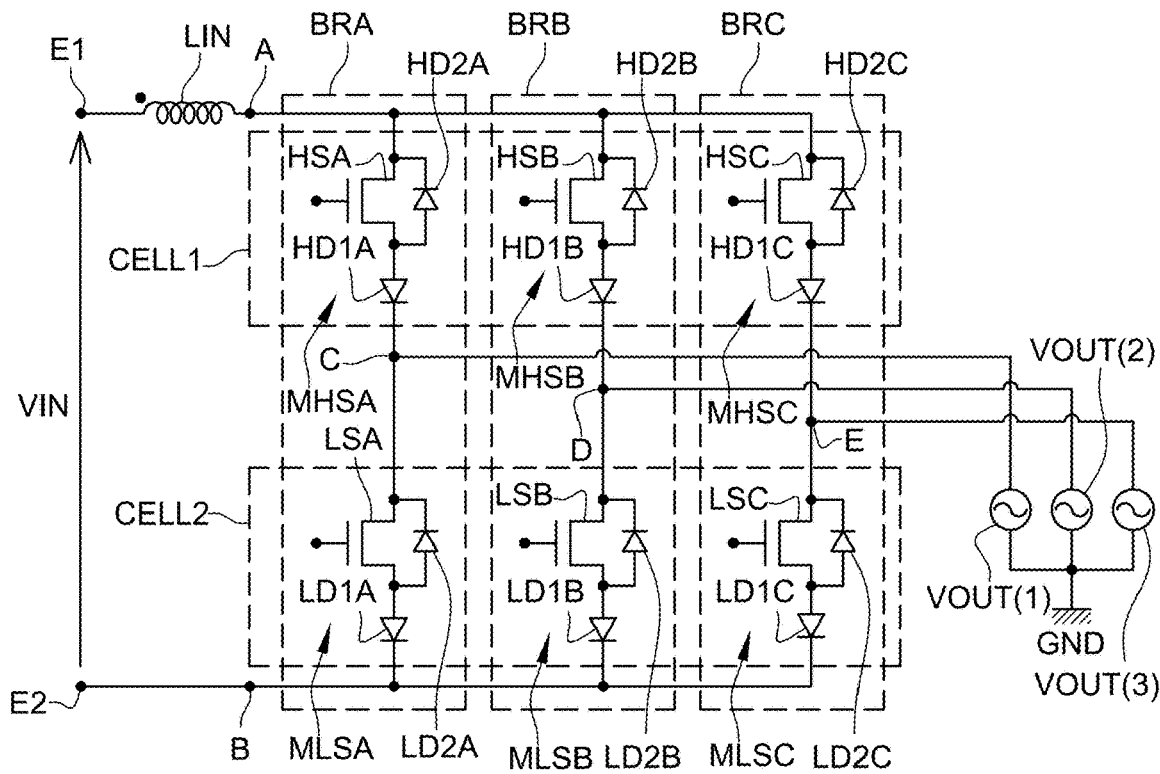
FIG. 1 is a simplified electric diagram of an example of an inverter comprising a three-phase current source.

FIG. 1 is a simplified electric diagram of an example of a current source inverter. The inverter of FIG. 1 is a three-phase inverter, that is, it generates a three-phase AC output voltage VOUT from a DC input voltage VIN.

The inverter of FIG. 1 comprises three arms BRA, BRB, and BRC connected in parallel between nodes A and B of the inverter. Each arm comprises two power macroswitches, each comprising two conduction nodes and one control node, series-coupled by their conduction nodes between nodes A and B. More particularly, arm BRA comprises two power macroswitches MHSA and MLSA series-coupled by their conduction nodes between nodes A and B, arm BRB comprises two power switches MHSB and MLSB series-coupled by their conduction nodes between nodes A and B, and arm BRC comprises two power switches MHSC and MLSC series-coupled by their conduction nodes between nodes A and B. Macroswitches MHSA, MHSB, and MHSC are for example identical to within manufacturing dispersions. Macroswitches MLSA, MLSB, and MLSC are for example identical to within manufacturing dispersions. Switches MHSA, MHSB, and MHSC may be identical to switches MLSA, MLSB, and MLSC, to within manufacturing dispersions.

Each of macroswitches MHSA, MHSB, MHSC, MLSA, MLSB, and MLSC is bidirectional for voltage. For this purpose, each macroswitch may for example comprise an association of a plurality of switches. In the shown example, each macroswitch comprises a series association of a controlled switch, for example, a transistor, and of a non-controlled switch, for example, a diode.

More Particularly, in the Present Example:
macroswitch MHSA comprises a controlled power switch HSA and a power diode HD1A in series between node A and an intermediate node C of arm BRA,
macroswitch MLSA comprises a controlled power switch LSA and a power diode LD1A in series between node C and node B,
macroswitch MHSB comprises a controlled power switch HSB and a power diode HD1B in series between node A and an intermediate node D of arm BRB,
macroswitch MLSB comprises a controlled power switch LSB and a power diode LD1B in series between node D and node B,
macroswitch MHSC comprises a controlled power switch HSC and a power diode HD1C in series between node A and an intermediate node E of arm BRC,
macroswitch MLSC comprises a controlled power switch LSC and a power diode LD1C in series between node E and node B.

Each of diodes HD1A, HD1B, HD1C, LD1A, LD1B, LD1C is forward-assembled between node A and node B, that is, each of diodes HD1A, HD1B, HD1C, LD1A, LD1B, LD1C has its anode coupled to node A and its cathode coupled to node B.

In the Shown Example:
switch HSA has a first conduction node connected to node A and a second conduction node connected to the anode of diode HD1A, diode HD1A has its cathode connected to node C, switch LSA has a first conduction node connected to node C and a second conduction node connected to the anode of diode LD1A, and diode LD1A has its cathode connected to node B,
switch HSB has a first conduction node connected to node A and a second conduction node connected to the anode of diode HD1B, diode HD1B has its cathode connected to node D, switch LSB has a first conduction node connected to node D and a second conduction node connected to the anode of diode LD1B, and diode LD1B has its cathode connected to node B; and
switch HSC has a first conduction node connected to node A and a second conduction node connected to the anode of diode HD1C, diode HD1C has its cathode connected to node E, switch LSC has a first conduction node connected to node E and a second conduction node connected to the anode of diode LD1C, and diode LD1C has its cathode connected to node B.

Diodes HD1A, HD1B, HD1C, LD1A, LD1B, LD1C are for example identical to within manufacturing dispersions. Switches HSA, HSB, and HSC are for example identical to within manufacturing dispersions. Switches LSA, LSB, and LSC are for example identical to within manufacturing dispersions. Switches HAS, HSB, and HSC may be identical to switches LSA, LSB, and LSC, to within manufacturing dispersions.

In the example of FIG. 1, each macroswitch comprises a diode connected in parallel with its controlled switch. More particularly, arm BRA comprises two diodes HD2A and LD2A respectively connected in parallel with switches HSA and LSA, arm BRB comprises two diodes HD2B and LD2B respectively connected in parallel with switches HSB and LSB, and arm BRC comprises two diodes HD2C and LD2C respectively connected in parallel with switches HSC and LSC. Each of diodes HD2A, HD2B, HD2C, LD2A, LD2B, LD2C is reverse-assembled between node A and node B, that is, each of diodes HD2A, HD2B, HD2C, LD2A, LD2B, LD2C has its cathode coupled to node A and its anode coupled to node B.

In the Shown Example:

diode HD2A has its anode coupled, for example, connected, to the anode of diode HD1A and its cathode coupled, for example, connected, to node A;

diode HD2B has its anode coupled, for example, connected, to the anode of diode HD1B and its cathode coupled, for example, connected, to node A;

diode HD2C has its anode coupled, for example, connected, to the anode of diode HD1C and its cathode coupled, for example, connected, to node A;

diode LD2A has its anode coupled, for example, connected, to the anode of diode LD1A and its cathode coupled, for example, connected, to node C;

diode LD2B has its anode coupled, for example, connected, to the anode of diode LD1B and its cathode coupled, for example, connected, to node D; and diode LD2C has its anode coupled, for example, connected, to the anode of diode LD1C and its cathode coupled, for example, connected, to node E.

Switches HSA, HSB, HSC, LSA, LSB, LSC are for example field-effect transistors, for example, gallium nitride transistors, the conduction nodes of the switches for example respectively corresponding to source and drain nodes of the transistors, and the control nodes of the switches corresponding to gate nodes of the transistors. Diodes HD2A, HD2B, HD2C, LD2A, LD2B, LD2C for example correspond to body diodes intrinsic to transistors HSA, respectively HSB, respectively HSC, respectively LSA, respectively LSB, respectively LSC. As a variant, diodes HD2A, HD2B, HD2C, LD2A, LD2B, LD2C may be specific components distinct from transistors HSA, HSB, HSC, LSA, LSB, LSC.

As a variant, each of macroswitches MHSA, MHSB, MHSC, MLSA, MLSB, MLSC corresponds to a series association of two controlled switches, for example, two field-effect transistors connected in anti-series (that is, having their intrinsic diodes head-to-tail).

The inverter of FIG. 1 further comprises an input inductance LIN series-coupled with the parallel association of arms BRA, BRB, and BRC, between nodes E1 and E2 of application of the input voltage VIN of the inverter. More particularly, in the shown example, inductance LIN has a first end coupled, for example, connected, to node E1, and a second end coupled, for example, connected, to node A. Node B is coupled, for example, connected, to node E2. As a variant, inductance LIN may be divided into two inductances respectively connected between node E1 and node A and between node E2 and node B. In another variant, inductance LIN may be only connected between nodes E2 and B.

The inverter of FIG. 1 is capable of supplying a first phase VOUT(1) of the three-phase AC output voltage VOUT between node C and a reference node or neutral GND, a second phase VOUT(2) of the three-phase AC output voltage VOUT between node D and node GND, and a third phase VOUT(3) of the three-phase AC output voltage VOUT between node E and a reference node or neutral GND. For this purpose, macroswitches MHSA, MHSB, MHSC, MLSA, MLSB, and MLSC are periodically controlled in switched mode according to an appropriate control sequence.

In the inverter of FIG. 1, macroswitches MHSA, MHSB, and MHSC respectively couple node E1 to three output nodes C, D, and E of the inverter, and define a first switching cell CELL1 of the inverter. Macroswitches MLSA, MLSB, and MLSC respectively couple nodes C, D, E to node E2 and define a second switching cell CELL2.

In such an inverter, it should be ascertained that at any time, at least one power macroswitch of switching cell CELL1 and at least one power macroswitch of switching cell CELL2 are on (conducting), this, to avoid a placing in open circuit of the input current source, which might cause the destruction of the power macroswitches.

Figure 2:
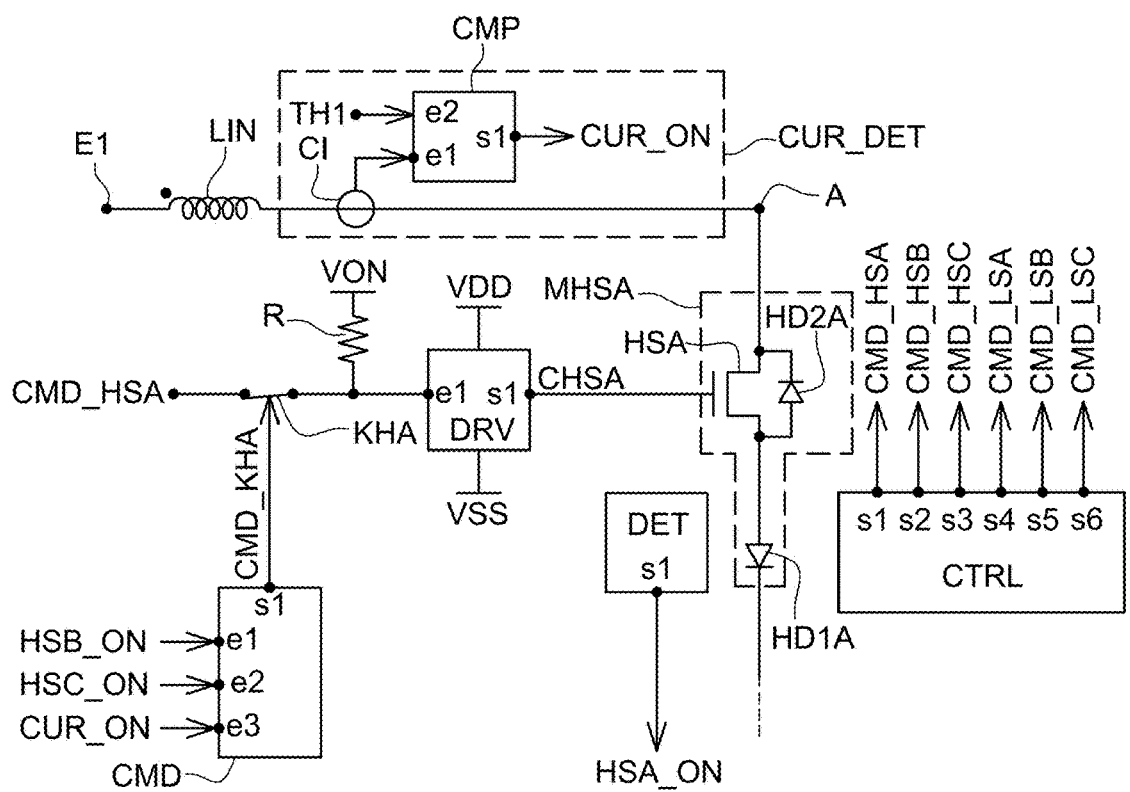
FIG. 2 schematically and partially shows an example of a circuit for protecting a current source inverter according to an embodiment.

FIG. 2 schematically and partially shows an example of an embodiment of a current source inverter provided with a circuit of protection against a placing in open circuit of its input current source.

The inverter of FIG. 2 comprises the same elements as the inverter of FIG. 1, arranged substantially in the same way. For simplification, among the elements of FIG. 1, only power macroswitch MHSA and input inductance LIN have been shown in FIG. 2.

In this example, the inverter comprises a control circuit CTRL common to all macroswitches MHSA, MHSB, MHSC, MLSA, MLSB, and MLSC, determining the control sequence of switches MHSA, MHSB, MHSC, MLSA, MLSB, and MLSC. Control circuit CTRL for example comprises a microprocessor, or any other adapted electronic control device (FPGA, microcontroller, etc.). In operation, control circuit CTRL delivers in parallel, for example, on six different output nodes s1, s2, s3, s4, s5, and s6, six signals CMD_HSA, CMD_HSB, CMD_HSC, CMD_LSA, CMD_LSB, CMD_LSC, respectively corresponding to control set points to be applied to the controlled switches HSA, HSB, HSC, LSA, LSB, and LSC of macroswitches MHSA, MHSB, MHSC, MLSA, MLSB, and MLSC. Each of signals CMD_HSA, CMD_HSB, CMD_HSC, CMD_LSA, CMD_LSB, CMD_LSC is a binary signal capable of taking one or the other of two discrete states respectively corresponding to a set point value for controlling the corresponding power switch to the on state. Control circuit CTRL is also called remote control circuit.

The inverter of FIG. 2 further comprises, for each of power switches HSA, HSB, HSC, LSA, LSB, LSC, a driver circuit DRV, also called close control circuit.

Each of driver circuits DRV comprises an input node e1 coupled to the output node of the control circuit CTRL supplying the set point signal for controlling the corresponding power switch, and an output node s1 coupled to the control node of the power switch.

Each of driver circuits DRV is capable of converting the set point control signal CMD_HSA, respectively CMD_HSB, respectively CMD_HSC, respectively CMD_LSA, respectively CMD_LSB, respectively CMD_LSC applied to its input node e1 into a corresponding control signal CHSA, respectively CHSB, respectively CHSC, respectively CLSA, respectively CLSB, respectively CLSC supplied on its output node s1, having a level capable of being directly applied to the control node of the corresponding power switch to control the switch to the off state and to the on state.

In FIG. 2, for simplification, only the driver circuit DRV of switch HSA, supplying control signal CHSA, has been shown.

In this example, each of driver circuits DRV comprises a terminal of application of a low power supply voltage VSS having a level capable of controlling the corresponding power switch to the off state, and a terminal of application of a high power supply voltage VDD having a level capable of controlling the corresponding power switch to the on state. When the set point signal applied to input node e1 of circuit DRV is in a first state corresponding to a set point value for controlling the power switch to the on state, for example a high state, circuit DRV delivers on its output node s1 a voltage substantially equal to its high power supply voltage VDD, to turn on the power transistor. When the set point signal applied to input node e1 of circuit DRV is in a second state corresponding to a set point for controlling the power switch to the off state, circuit DRV delivers on its output node s1 a voltage substantially equal to its low power supply voltage VSS, to turn off the power switch.

In the example of FIG. 2, the output nodes s1 of driver circuits DRV are directly connected to the control nodes of the corresponding power switches. However, the input nodes e1 of the driver circuits are coupled to the nodes for supplying control signals CMD_HSA, respectively CMD_HSB, respectively CMD_HSC, respectively CMD_LSA, respectively CMD_LSB, respectively CMD_LSC via protection switches rather than directly. More particularly, in the present example, for each of power switches HSA, respectively HSB, respectively HSC, respectively LSA, respectively LSB, respectively LSC, the inverter comprises a protection switch KHA, respectively KHB, respectively KHC, respectively KLA, respectively KLB, respectively KLC having a first conduction node coupled, for example, connected, to the node for supplying the corresponding control signal CMD_HSA, respectively CMD_HSB, respectively CMD_HSC, respectively CMD_LSA, respectively CMD_LSB, respectively CMD_LSC of the power switch, and a second conduction node coupled, for example, connected, to the input node e1 of the driver circuit of the power switch.

In FIG. 2, for simplification, only the protection switch KHA of power switch HSA has been shown.

In the example of FIG. 2, for each of the power switches, the inverter further comprises a circuit DET for detecting the off or on state of the switch. Each circuit DET supplies, on an output node s1 of the circuit, a binary signal capable of taking two discrete states respectively representative of the off or on state of the corresponding power switch. More particularly, in the present example, the circuit DET of switch HSA supplies a signal HAS_ON representative of the off or on state of switch HSA, the circuit DET of switch HSB supplies a signal HSB_ON representative of the off or on state of switch HSB, the circuit DET of switch HSC supplies a signal HSC_ON representative of the off or on state of switch HSC, the circuit DET of switch LSA supplies a signal LSA_ON representative of the off or on state of switch LSA, the circuit DET of switch LSB supplies a signal LSB_ON representative of the off or on state of switch LSB, and the circuit DET of switch LSC supplies a signal LSC_ON representative of the off or on state of switch LSC. Each of signals HSA_ON, HSB_ON, HSC_ON, LSA_ON, LSB_ON, and LSC_ON is for example in a high state when the corresponding power switch is on (conducting) and in a low state when the corresponding power switch is off (non-conducting).

In FIG. 2, for simplification, only the circuit DET associated with power switch HSA has been shown.

In the example of FIG. 2, for each of power switches HSA, respectively HSB, respectively HSC, respectively LSA, respectively LSB, respectively LSC, the inverter further comprises a circuit CMD for controlling the protection switch KHA, respectively KHB, respectively KHC, respectively KLA, respectively KLB, respectively KLC, of the power switch.

More particularly, in the present example, for each power switch, circuit CMD for controlling the protection switch of the power switch comprises two input nodes e1 and e2 coupled, for example, connected, respectively to the output nodes s1 of the detection circuits DET of the two other power switches belonging to the same switching cell. In other words, the input nodes e1 and e2 of the circuit CMD of switch HSA are coupled, for example, connected, respectively to the output node s1 of the circuit DET of switch HSB and to the output node s1 of the circuit DET of switch HSC, the input nodes e1 and e2 of the circuit CMD of switch HSB are coupled, for example, connected, respectively to the output node s1 of the circuit DET of switch HSA and to the output node s1 of the circuit DET of switch HSC, the input nodes e1 and e2 of the circuit CMD of switch HSC are coupled, for example, connected, respectively to the output node s1 of the circuit DET of switch HSA and to the output node s1 of the circuit DET of switch HSB, the input nodes e1 and e2 of the circuit CMD of switch LSA are coupled, for example, connected, respectively to the output node s1 of the circuit DET of switch LSB and to the output node s1 of the circuit DET of switch LSC, the input nodes e1 and e2 of the circuit CMD of switch LSB are coupled, for example, connected, respectively to the output node s1 of the circuit DET of switch LSA and to the output node s1 of the circuit DET of switch LSC, and the input nodes e1 and e2 of the circuit CMD of switch LSC are coupled, for example, connected, respectively to the output node s1 of the circuit DET of switch LSA and to the output node s1 of the circuit DET of switch LSB.

In the example of FIG. 2, the inverter further comprises a circuit CUR_DET supplying a binary signal CUR_ON capable of taking two discrete states respectively representative of the presence or of the absence of a significant current in the inverter. Signal CUR_ON is for example in a high state when a significant current flows through the inverter, and in a low state when not significant current flows through the inverter, for example, when the inverter is not powered. In the present example, circuit CUR_DET comprises a current sensor CI placed in series with input inductance LIN, for example, between inductance LIN and node A. Sensor CI (not detailed in the drawing) for example comprises a measurement resistor placed in series with inductance LIN, and a circuit for measuring a voltage across the measurement resistor. Sensor CI for example delivers a voltage representative of the intensity of the current flowing through inductance LIN. Circuit CUR_DET further comprises a comparator CMP comprising a first input node e1 receiving the output voltage of the sensor CI and a second input node e2 having a predetermined voltage threshold TH1 applied thereto. The comparator further comprises an output node s1 supplying the output signal CUR_ON of circuit CUR_DET. Thus, when the output signal of current sensor CI is greater than threshold TH1, that is, when the current flowing through inductance LIN is greater than a predetermined threshold, the output signal CUR_ON of circuit CUR_DET is in a first state, for example, in the high state, and when the output signal of current sensor CI is smaller than threshold TH1, the output signal CUR_ON of circuit CUR_DET is in a second state, for example, in the low state.

In the example of FIG. 2, each circuit CMD further comprises a third input node e3 receiving the output signal CUR_ON of circuit CUR_DET. For this purpose, each control circuit CMD may have its input node e3 coupled, for example, connected, to the output node s1 of the comparator CMP of circuit CUR_DET.

Each circuit CMD further comprises an output node s1 coupled, for example, connected, to a control node of the corresponding protection switch KHA, respectively KHB, respectively KHC, respectively KLA, respectively KLB, respectively KLC. The control circuit CMD of protection switch KHA delivers on its output node s1 a signal CMD_KHA for controlling switch KHA, the control circuit CMD of protection switch KHB delivers on its output node s1 a signal CMD_KHB for controlling switch KHB, the control circuit CMD of protection switch KHC delivers on its output node s1 a signal CMD_KHC for controlling switch KHC, the control circuit CMD of protection switch KLA delivers on its output node s1 a signal CMD_KLA for controlling switch KLA, the control circuit CMD of protection switch KLB delivers on its output node s1 a signal CMD_KLB for controlling switch KLB, and the control circuit CMD of protection switch KLC delivers on its output node s1 a signal CMD_KLC for controlling switch KLC.

In FIG. 2, for simplification, only the circuit CMD for controlling protection switch KHA has been shown.

In the example of FIG. 2, in each of switching cells CELL1 and CELL2, for each power switch of the cell, the circuit CMD for controlling the protection switch of the power switch is configured to control the protection switch to the on state when at least one of the two other power switches of the cell is in the on state or when no significant current flows through inductance LIN, and to control the protection switch to the off state when each of the two other power switches of the cell is in the off state and a significant current flows through the input inductance LIN of the inverter. For this purpose, in each circuit CMD, the output signal of circuit CMD is generated according to the signals received on its input terminals e1, e2, and e3.

In particular, in the present example, signal CMD_KHA is in a first state, for example, a high state, corresponding to a state for controlling transistor KHA to the off state, when signals HSB_ON and HSC_ON are both in the low state (switches HSB and HSC off) and signal CUR_ON is in the high state (flowing of a significant current through the inverter), and signal CMD_KHA is in a second state, for example, a low state, corresponding to a state for controlling transistor KHA to the on state, when at least one of signals HSB_ON and HSC_ON is the high state (at least one of switches HSB and HSC is on) or when signal CUR_ON is in the low state (no significant current through the inverter).

Similarly, in the present example, each of circuits CMD controls the protection switch with which it is associated to the off state when the signals received on its input terminals e1 and e2 are both in the low state and the signal received on its input terminal e3 is in the high state, and controls the protection switch to the on state when at least one of the signals received on its terminals e1 and e2 is in the high state or when the signal received on its terminal e3 is in the low state.

The inverter of FIG. 2 further comprises, for each of power switches HSA, HSB, HSC, LSA, LSB, LSC, a resistor R having a first end connected to the input terminal e1 of the driver circuit DRV of the power switch and a second end connected to a node VON of application of a voltage for controlling the switch to the on (conducting) state, for example, voltage VDD.

When protection switch KHA, respectively KHB, respectively KHC, respectively LSA, respectively LSB, respectively LSC of the power switch is in the on state, the control signal CMD_HSA, respectively CMD_HSB, respectively CMD_HSC, respectively CMD_LSA, respectively CMD_LSB, respectively CMD_LSC supplied by remote control circuit CTRL is applied to the input node e1 of the driver circuit DRV of the power switch, to control the power switch to the off state or to the on state (according to the state of the control signal supplied by control circuit CTRL). When the protection switch of the power switch is in the off state, the control signal supplied by remote control circuit CTRL is no longer applied to the input node e1 of the driver circuit DRV of the power switch. In this case, the voltage on the input node e1 of the driver circuit DRV of the power switch is drawn to the voltage of node VON by resistor R, which results in forcing the power switch to the on (conducting) state.

The assembly comprising current detection circuit CUR_DET, protection switches KHA, KHB, KHC, KLA, KLB, KLC, resistors R, the circuits DET for detecting the off or on state of the power switches, and the circuits CMD for controlling the protection switches forms a circuit of protection of the inverter against a placing in open circuit of its input current source.

The circuit enables to guarantee that at any time of the operation of the inverter (when the inverter is powered), at least one power switch of cell CELL1 and at least one power switch of cell CELL2 are on. This particularly enables to protect the inverter in case of a failure of distant control circuit CTRL or in case of a loss of connection between distant control circuit CTRL and close control circuits DRV.

Signals CMD_KHA, CMD_KHB, CMD_KHC, CMD_KLA, CMD_KLB, and CMD_KLC may further be transmitted to control circuit CTRL, for example, to trigger an alert and/or a stopping of the inverter when one of the protection switches is triggered, that is, controlled to the off state.

The different elements of the protection circuit described hereabove may be formed by means of discrete components. As a variant, these elements may be totally or partly integrated in one or a plurality of semiconductor chips. As an example, for each power switch, a specific chip integrating the protection circuit, the circuit DET, and the circuit CMD of the power switch may be provided. In this case, each protection chip may comprise four terminals or tabs of connection to the outside respectively connected to the output node s1 of circuit DET and to the input nodes e1, e2, and e3 of circuit CMD. The driver circuit DRV of the power switch may further be integrated on the same chip, which will then comprise a fifth terminal or connection tab connected to the output node s1 of circuit DRV.

Preferably, protection switches KHA, KHB, KHC, KLA, KLB, KLC are normally-on (conducting) switches, for example, normally-on transistors. This enables the protection switches to be directly in closed configuration at the powering-on of the inverter. As a variant, protection switches KHA, KHB, KHC, KLA, KLB, KLC may be normally-off switches.

It should be noted that in the example described in relation with FIG. 2, the taking into account of the output signal CUR_ON of circuit CUR_DET to decide whether to trigger or not the protection, that is, to turn off a protection switch, enables to deactivate the security at the starting of the inverter, or when the inverter is off. The current threshold from which the security is activated (defined by threshold TH1) may be set by the user.

As a variant, protection switches KHA, KHB, KHC, KLA, KLB, KLC may be controlled without taking into account the presence or not of a significant current in the inverter. In this case, in each of switching cells CELL1 and CELL2, for each power switch of the cell, circuit CMD is configured to control the protection switch to the on state when at least one of the two other power switches of the cell is in the on state, and to control the protection switch to the off state when each of the two other power switches of the cell is in the off state. Detection circuit CUR_DET and the inputs e3 of circuits CMD may then be omitted.

Figure 3:
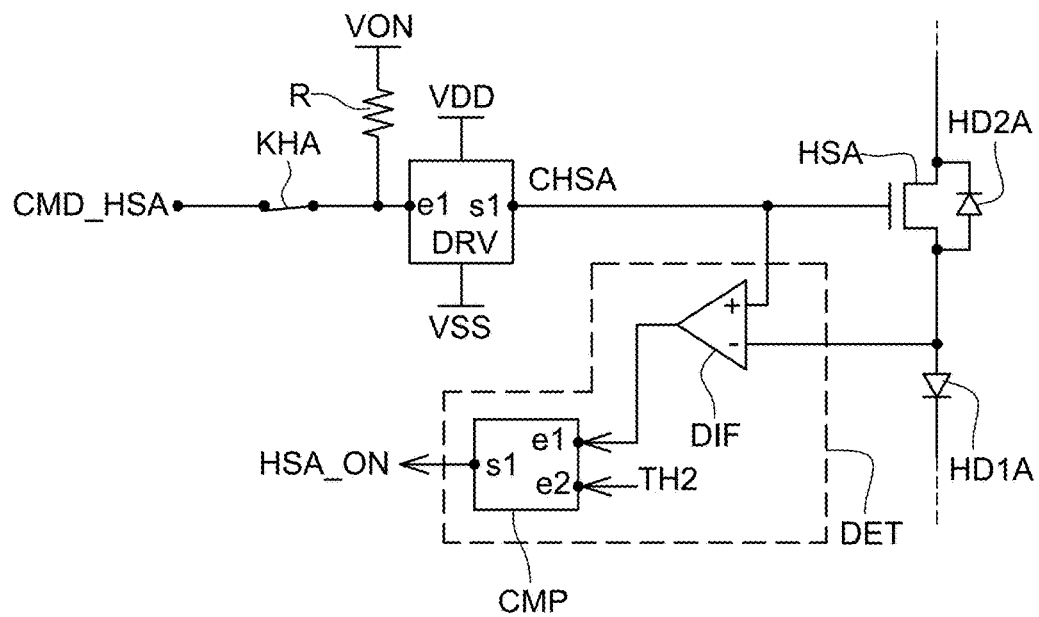
FIG. 3 shows in further detail an embodiment of a circuit for detecting the state of a power switch, of the protection circuit of FIG. 2.

FIG. 3 shows in further detail an embodiment of a circuit DET for detecting the off or on state of a power switch of the inverter of FIG. 2. In FIG. 3, the detailed circuit DET is that of the power switch HSA of the inverter, it being understood that the circuits DET of the other power switches may be identical or similar. FIG. 3 further shows the same elements as FIG. 2, except for input inductance LIN, input current detection circuit CUR_DET, and circuit CMD, which have not been shown for simplification.

In this example, circuit DET comprises a differential voltage measurement circuit DIF having a positive input terminal (+) coupled, for example, connected, to the control terminal of power switch HSA and a negative input terminal (−) coupled, for example, connected, to the conduction terminal of switch HSA located on the anode side of diode HD1A. Circuit DIF further comprises an output terminal supplying a signal representative of the voltage between its positive terminal (+) and its negative terminal (−). Circuit DET further comprises a comparator CMP comprising a first input node e1 receiving the output voltage of circuit DIF and a second input node e2 having a predetermined voltage threshold TH2 applied thereto. The comparator further comprises an output node s1 corresponding to the output node s1 of circuit DET, supplying the output signal HSA_ON of circuit DET. Thus, when the output signal of the voltage measurement circuit DIF is greater than threshold TH2, that is, when the voltage between the control node and the conduction node of switch HSA is greater than threshold TH2, the output signal HSA_ON of circuit DET is in a first state, for example, the high state, indicating that a signal for controlling to the on (conducting) state is applied to switch HSA, and, when the output signal of circuit DIF is smaller than threshold TH2, the output signal HSA_ON of circuit DET is in a second state, for example, the low state, indicating that a signal for controlling to the off (non-conducting) state is applied to switch HSA.

In this example, the power switches may be field-effect transistors, for example MOS transistors. The voltage measured by circuit DIF then corresponds to the gate-source voltage of the power transistor. In this case, threshold TH2 is for example greater than or equal to the threshold voltage or turn-on voltage of the transistor.

More generally, any other detection circuit enabling to detect the off or on state of the transistor may be used, for example a detection circuit comprising a current sensor placed in series with the power switch, or also a circuit measuring the signal CMD_HSA received on the input terminal e1 of driver circuit DRV, or also a circuit measuring the voltage between the conduction terminals of the power switch (drain-source voltage in the case of a MOS transistor).

Figure 4:
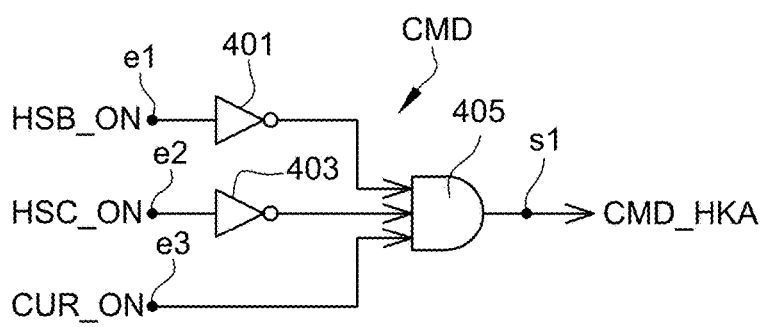
FIG. 4 shows in further detail an embodiment of a circuit for controlling a protection switch, of the protection circuit of FIG. 2.

FIG. 4 shows in further detail an embodiment of a circuit CMD for controlling a switch for protecting the inverter of FIG. 2. In FIG. 4, the detailed circuit CMD is that of the protection switch KHA of the power switch HSA of the inverter, it being understood that the circuits CMD of the other protection switches may be identical or similar to that of FIG. 4.

In this example, circuit CMD comprises two NOT gates 401 and 403 and one AND gate 405 with three inputs and one output. NOT gate 401 has an input node coupled, for example, connected, to the input node e1 of circuit CMD, and an output node coupled, for example, connected, to a first input node of AND gate 405. NOT gate 403 has an input node coupled, for example, connected, to the input node e2 of circuit CMD, and an output node coupled, for example, connected, to a second input node of AND gate 405. In this example, the third input node of AND gate 405 is directly coupled, for example, connected, to the input node e3 of circuit CMD. The output of AND gate 405 is coupled, for example, connected, to the output node s1 of circuit CMD.

In the case where the control of the protection switches does not take signal CUR_ON into account, AND gate 405 may be replaced with an AND gate with two inputs and one output.

An embodiment of a circuit for protecting a three-phase current source inverter has been described hereabove. The described embodiments may however be adapted to the protection of a single-phase current source inverter.

Figure 5:
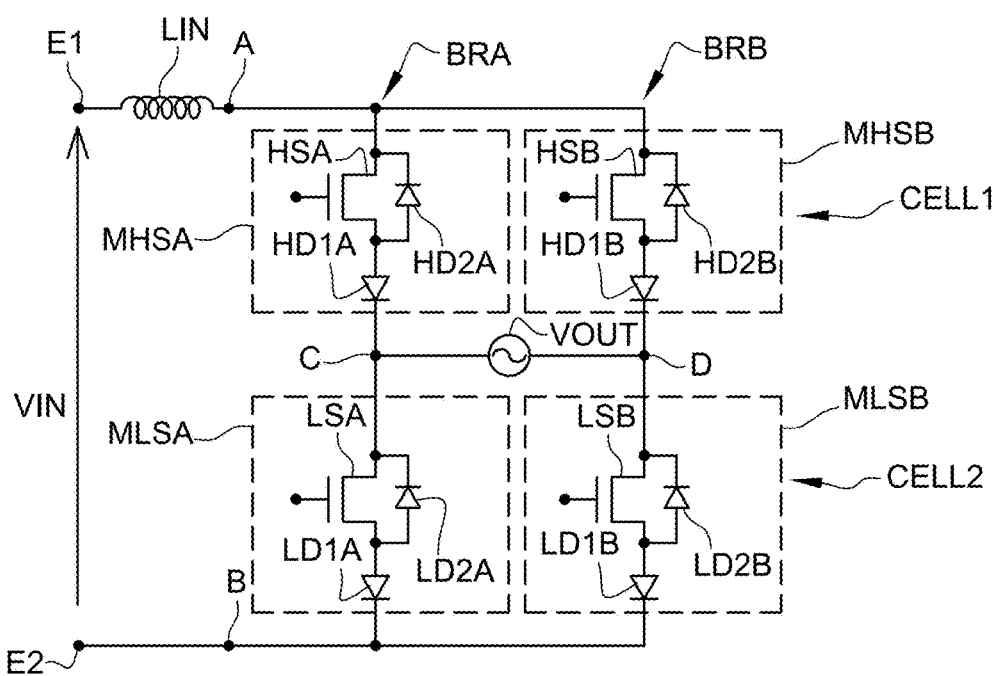
FIG. 5 is a simplified electric diagram of an example of a single-phase current source inverter.

FIG. 5 is a simplified electric diagram of an example of a single-phase current source inverter, that is, generating a single-phase AC output voltage VOUT from a DC input voltage VIN.

The inverter of FIG. 5 differs from the inverter of FIG. 1 essentially in that it comprises neither arm BRC, nor reference node GND. In the inverter of FIG. 5, AC output voltage VOUT is delivered between nodes C and D.

Thus, in the inverter of FIG. 5, each of switching cells CELL1 and CELL2 only comprises two power switches, instead of three in the inverter of FIG. 1.

The protection circuit described in relation with FIGS. 2 to 4 may be adapted to the single-phase inverter of FIG. 5. In particular, in the case of a single-phase inverter, in each of switching cells CELL1 and CELL2, for each of the two power switches of the cell, the circuit CMD for controlling the protection switch of the power switch is configured to control the protection switch to the on state when the other power switch of the cell is in the on state (or when no significant current flows through inductance LIN in the case where signal CUR_ON is taken into account to control the power switches), and to control the protection switch to the off state when the other power switch of the cell is in the off state (and a significant current flows through the input inductance LIN of the inverter in the case where signal CUR_ON is taken into account to control the protection switches). In other words, as compared with the example of FIGS. 2 and 4, the input node e2 of circuit CMD may be omitted. As compared with the example of FIG. 4, NOT gate 403 may be omitted and the AND gate 405 of FIG. 4 may be replaced with an AND gate with two inputs and one output, or omitted in the case where signal CUR_ON is not taken into account to control the protection switches (the output of NOT gate 401 then being directly coupled, for example, connected, to the output node s1 of circuit CMD).

Various embodiments and variants have been described. Those skilled in the art will understand that certain features of these various embodiments and variants may be combined, and other variants will occur to those skilled in the art. In particular, the described embodiments are not limited to the specific embodiment of circuit CMD described in relation with FIG. 4. More generally, it will be within the abilities of those skilled in the art to provide other implementations of circuit CMD, or also of circuit DET or of circuit CUR_DET, based on the functional indications of the present disclosure.

The invention claimed is:

1. A current source inverter, comprising:
   a first switching cell comprising at least first and second power switches coupling a same first input node of the current source inverter respectively to first and second output nodes of the current source inverter; and
   a protection circuit, for protecting an input current source of the current source inverter from being placed in an open circuit, comprising, for each respective power switch of the first switching cell:
- a protection switch coupling a node for supplying a set point signal for controlling the power switch to a control node of the power switch;
- a detection circuit for detecting an off or on state of the power switch; and
- a control circuit for controlling the protection switch receiving, for each of the other power switches of the first switching cell, an output signal of the detection circuit of the other power switches.

2. The current source inverter according to claim 1, wherein, for each power switch of the first switching cell, the control circuit of the protection switch for protecting the power switch is configured to control the protection switch to an on state when at least one of the other power switches of the first switching cell is in the on state, and to control the protection switch to the off state when no other power switch of the first switching cell is in the on state.

3. The current source inverter according to claim 1, wherein the first switching cell further comprises a third power switch coupling the first input node of the inverter to a third output node of the inverter.

4. The current source inverter according to claim 1, further comprising a second switching cell comprising at least first and second power switches respectively coupling the first and second output nodes of the current source inverter to a same second input node of the current source inverter, and wherein the protection circuit comprises, for each respective power switch of the second switching cell:
- a protection switch coupling a node for supplying a control signal of the power switch to a control node of the power switch;
- a detection circuit for detecting an off or on state of the power switch; and
- a control circuit for controlling the protection switch receiving, for each of the other power switches of the second switching cell, an output signal of the detection circuit of the other power switches.

5. The current source inverter according to claim 4, wherein, for each power switch of the second switching cell, the control circuit of the protection switch for protecting the power switch is configured to control the protection switch to an on state when at least one of the other power switches of the second switching cell is in the on state, and to control the protection switch to the off state when no other power switch of the second switching cell is in the on state.

6. The current source inverter according to claim 4, wherein the second switching cell further comprises a third power switch coupling a third output node of the current source inverter to the second input node of the current source inverter.

7. The current source inverter according to claim 1, further comprising a circuit for detecting a presence of an input current in the current source inverter, each control circuit receiving an output signal of the circuit for detecting the presence of the input current and being configured to control the protection switch with which it is associated to the off state only when an input current is detected in the current source inverter.

8. The current source inverter according to claim 1, wherein the protection circuit further comprises, for each power switch, a resistor having a first end connected to a conduction node of the protection switch opposite to the node for supplying the set point signal for controlling the power switch, and a second end connected to a node of application of a control voltage in the on state of the power switch.

9. The current source inverter according to claim 1, further comprising, for each power switch, a driver circuit or close control circuit having an input node connected to a conduction node of the protection switch opposite to the node for supplying the set point signal for controlling the power switch, and an output node connected to the control node of the power switch.

10. The current source inverter according to claim 9, further comprising a control circuit or remote control circuit common to the at least first and second power switches and supplying the set point signals for controlling the at least first and second power switches.

11. The current source inverter according to claim 1, wherein, for each power switch, the circuit for detecting the off or on state of the power switch comprises a circuit of differential measurement of a voltage between the control node of the power switch and a conduction node of the power switch.

* * * * *